United States Patent [19]

Michii et al.

[11] Patent Number: 5,220,196

[45] Date of Patent: Jun. 15, 1993

[54] SEMICONDUCTOR DEVICE

[75] Inventors: Kazunari Michii; Haruo Shimamoto; Masataka Takehara, all of Itami, Japan

[73] Assignee: Mitsubishi Denki Kabushiki Kaisha, Tokyo, Japan

[21] Appl. No.: 787,127

[22] Filed: Nov. 4, 1991

[30] Foreign Application Priority Data

Nov. 28, 1990 [JP] Japan .................. 2-322287

[51] Int. Cl.[5] ............... H01L 23/48; H01L 23/28
[52] U.S. Cl. .................. 257/668; 257/676; 257/787
[58] Field of Search .............. 357/70, 72, 74, 80

[56] References Cited

U.S. PATENT DOCUMENTS

| 4,801,999 | 1/1989 | Hayward et al. | 357/70 |
| 4,903,113 | 2/1990 | Frankeny et al. | 357/74 |
| 4,949,158 | 8/1990 | Ueda | 357/70 |
| 5,036,380 | 7/1991 | Chase | 357/70 |
| 5,049,974 | 9/1991 | Nelson et al. | 357/70 |
| 5,067,005 | 11/1991 | Michii et al. | 357/70 |

Primary Examiner—Eugene R. LaRoche
Assistant Examiner—Viet Q. Nguyen
Attorney, Agent, or Firm—Leydig, Voit & Mayer

[57] ABSTRACT

A semiconductor device includes an insulating substrate; a semiconductor chip on which plural electrodes including at least one ground electrode and at least one power source electrode are disposed; plural leads supported by an obverse surface of the insulating substrate, the plural leads being connected to corresponding electrodes on the semiconductor chip; at least one grounding conductor plate on a reverse surface of the insulating substrate; and at least one power source conductor plate on the reverse surface of the insulating substrate. This semiconductor device includes grounding contact holes for electrically connecting the grounding conductor plate to a ground lead coupled to the ground electrode on the semiconductor chip; power source contact holes for electrically connecting the power source conductor plate to a power source lead coupled to the power source electrode on the semiconductor chip; and a package body encapsulating the semiconductor chip and an end of each of the leads so that the other end of each of the leads is exposed outside the package body.

8 Claims, 3 Drawing Sheets

SEMICONDUCTOR DEVICE

BACKGROUND OF THE INVENTION

1. Field of the Invention

The present invention relates to a semiconductor device and, more particularly, to a multi-pin semiconductor device having several hundred external leads.

2. Description of the Related Art

Semiconductor devices manufactured by using a type of tape carrier called a "TAB" (tape automated bonding) have been used as low-cost packages with a large number of pins. FIGS. 4 and 5 show this type of conventional semiconductor device. A semiconductor chip 1 is placed in an opening 3a formed in an insulating tape 3. Plural electrodes 2 arranged on the obverse surface of the semiconductor chip 1 are electrically connected to inner leads 4a of plural leads 4 which are disposed on the insulating tape 3. The semiconductor chip 1 and the inner leads 4a are encapsulated in a resin package body 7 so that outer leads 4b of the respective leads 4 are exposed.

As the number of leads 4 connected to the semiconductor chip 1 increases, it is necessary to enlarge the size of the package body 7 in order to expose the respective outer leads 4b. For this reason, the respective leads 4 in the package body 7 are made long and narrow. As a result, the inductance of a grounding lead and a power source lead is increased, generating switching noise during high-speed operation. The semiconductor device is thus liable to malfunctioning.

SUMMARY OF THE INVENTION

Accordingly, the object of the present invention is to provide a semiconductor device having superior electrical characteristics, which is not susceptible to malfunctioning even during high-speed operation, and which solves the above problem.

In order to achieve the above object, according to this invention, there is provided a semiconductor device comprising: an insulating substrate; a semiconductor chip having an obverse surface on which plural electrodes including at least one ground electrode and at least one power source electrode are disposed; plural leads supported by an obverse surface of said insulating substrate, one end of each of said plural leads being connected to a corresponding electrode on said semiconductor chip; at least one grounding conductor plate provided on a reverse surface of said insulating substrate; at least one power source conductor plate provided on the reverse surface of said insulating substrate; first connecting means for electrically connecting said grounding conductor plate to a ground lead coupled to the ground electrode on said semiconductor chip; second connecting means for electrically connecting said power source conductor plate to a power source lead coupled to the power source electrode on said semiconductor chip; a package body encapsulating said semiconductor chip and the end of each of said plural leads so that the other end of each of said plural leads is exposed outside the package body.

DESCRIPTION OF THE PREFERRED EMBODIMENT

An embodiment of the present invention will be described below with reference to the accompanying drawings.

Figure 1:
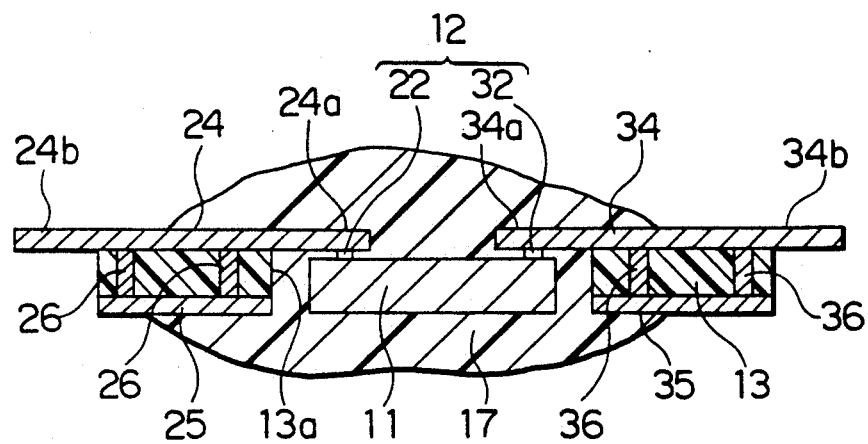
FIG. 1 is a cross-sectional view showing a semiconductor device in accordance with an embodiment of the present invention.
Figure 2:
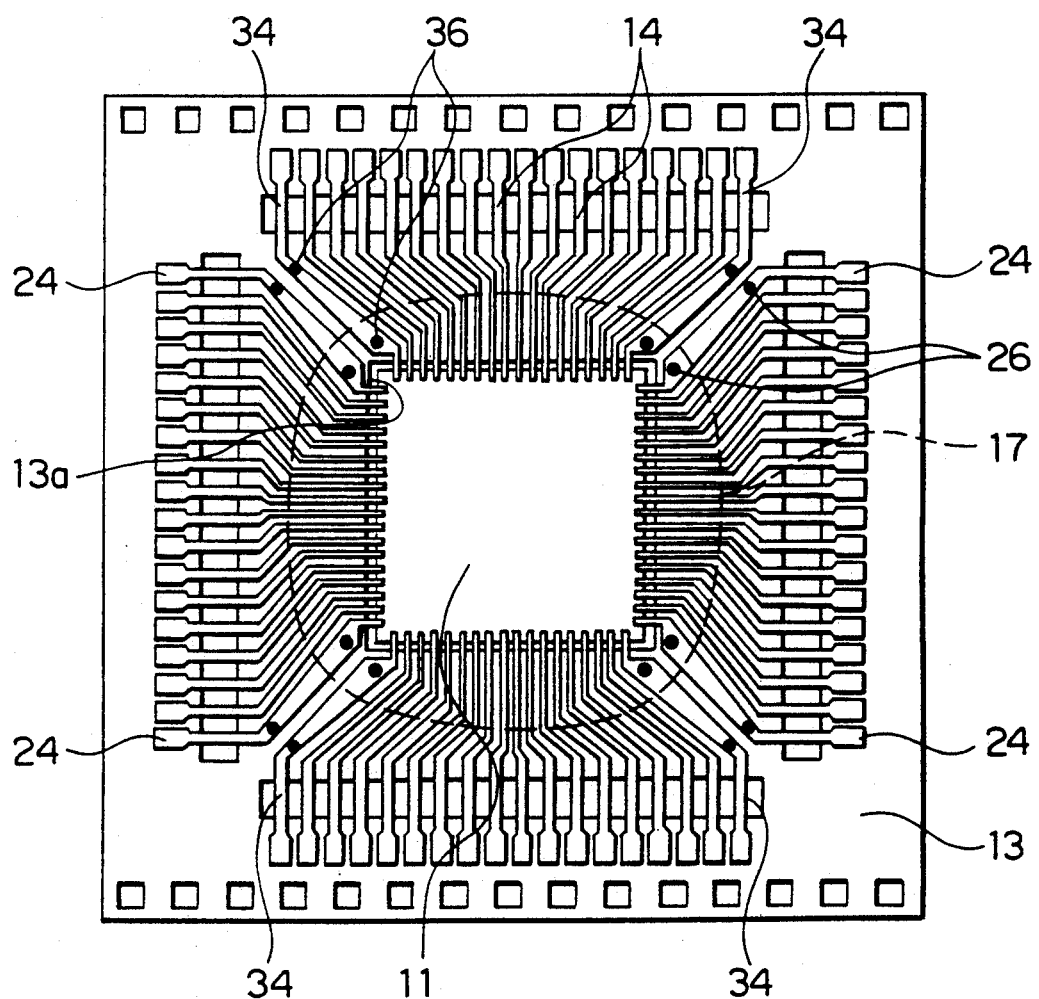
FIG. 2 is a plan view of the semiconductor device of FIG. 1 with an upper portion thereof removed.

FIG. 1 is a cross-sectional view showing a semiconductor device in accordance with an embodiment of this invention. An opening 13a in which a semiconductor chip 11 is positioned is formed in an insulating substrate 13 made of, for example, a polyimide tape. Plural electrodes 12, including ground electrodes 22 and power source electrodes 32, are disposed on the obverse surface of the semiconductor chip 11. As shown in FIG. 2, on the other hand, plural leads 14, including ground leads 24 and power source leads 34, are affixed to the obverse surface of the insulating substrate 13. One end of each lead 14, serving as an inner lead, is connected to the corresponding electrode 12 on the semiconductor chip 11. As illustrated in FIG. 1, inner leads 24a of the ground leads 24 are connected to the ground electrodes 22 on the semiconductor chip 11, whereas inner leads 34a of the power source leads 34 are connected to the power source electrodes 32 on the semiconductor chip 11.

Figure 3:
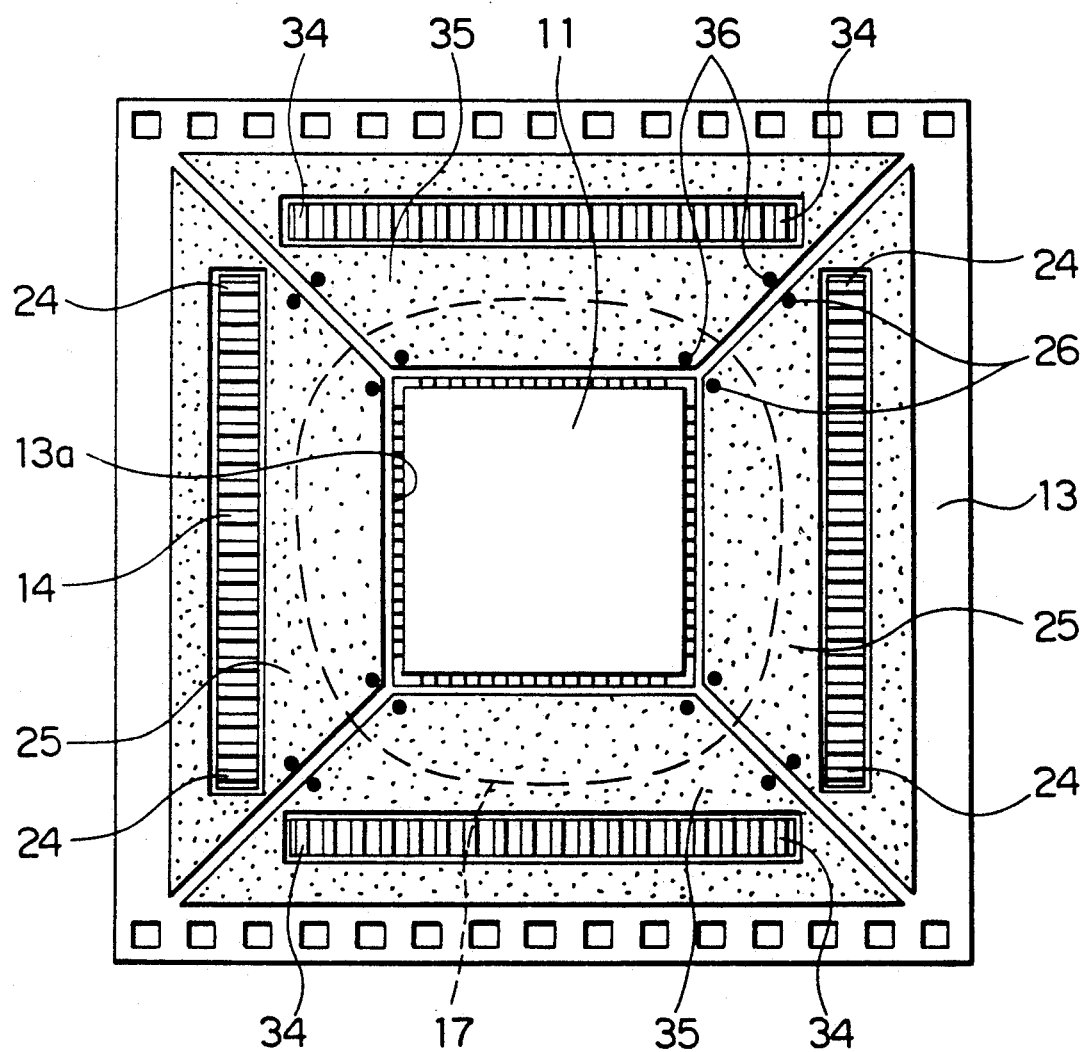
FIG. 3 is a plan view of the semiconductor device of FIG. 1 with a lower portion thereof removed.
Figure 4:
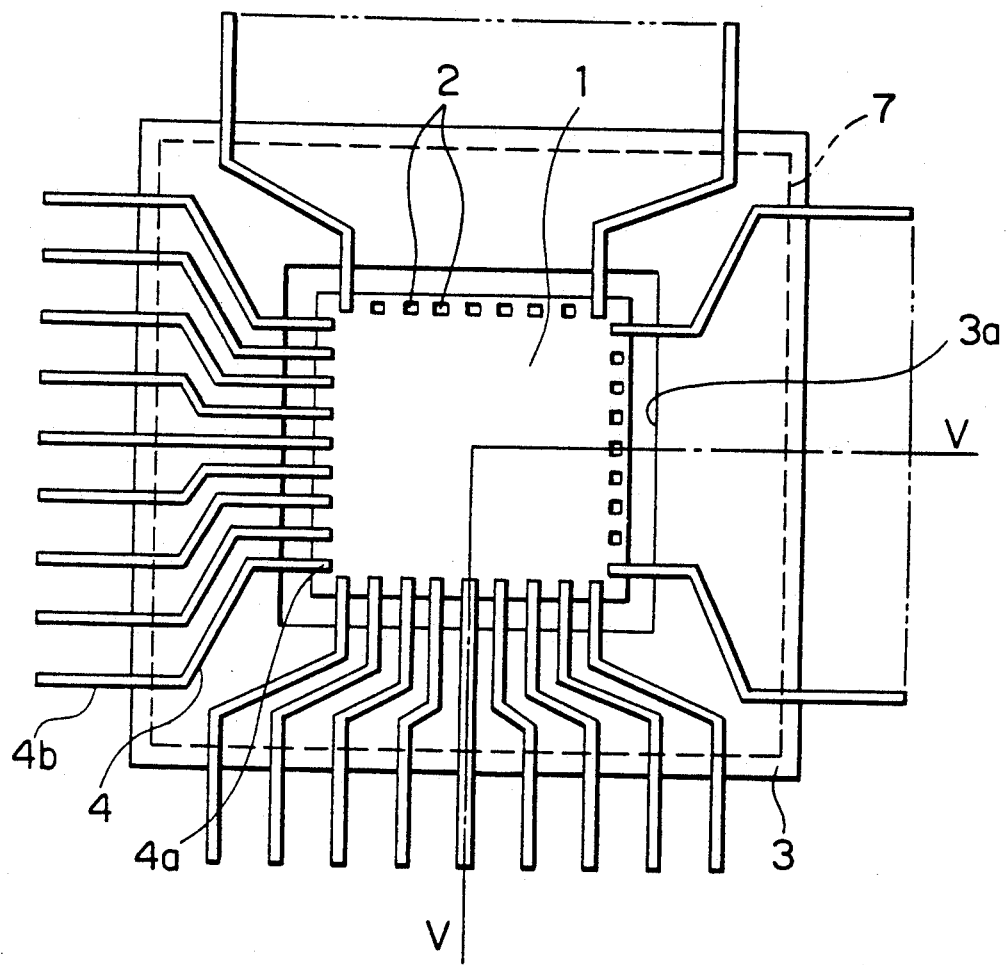
FIG. 4 is a plan view showing the conventional semiconductor device.
Figure 5:
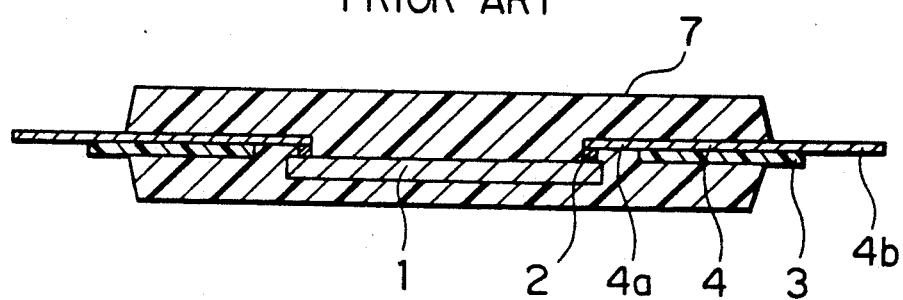
FIG. 5 is a cross-sectional view taken along line V—V of FIG. 4.

Also, as shown in FIG. 3, two grounding conductor plates 25 and two power source conductor plates 35 are arranged around the opening 13a on the reverse surface of the insulating substrate 13. As illustrated in FIG. 1, these grounding conductor plates 25 are electrically connected to the ground leads 24 through contact holes 26 formed in the insulating substrate 13. Similarly, the power source conductor plates 35 are electrically connected to the power source leads 34 through contact holes 36 formed in the insulating substrate 13.

The semiconductor chip 11, the inner leads of the respective leads 14, and a portion around the opening 13a of the insulating substrate 13, are encapsulated by a package body 17 made of resin such as epoxy. However, the outer leads of the respective leads 14, for instance, the outer lead 24a of the ground lead 24 and the outer lead 34a of the power source lead 34, are exposed outside the package body 17.

In a thus-constructed semiconductor device, it is possible to reduce the inductance of the power supply system extending from the power source to the ground. This is because the ground leads 24 and the power source leads 34 are electrically connected to the grounding conductor plates 25 and the power source conductor plates 35, respectively, each of these plates having a large area. That is, even when a semiconductor device is provided with as many as several hundred leads 14, it is possible to prevent malfunctioning of the semiconductor device due to switching noise or the like.

Although the two grounding conductor plates 25 and the two power source conductor plates 35 are arranged on the reverse surface of the insulating substrate 13, the present invention is not limited to such arrangement. At least one grounding conductor plate and at least one power source conductor plate may also be arranged on the reverse surface of the insulating substrate 13.

What is claimed is:

1. A semiconductor device comprising:

an insulating substrate having obverse and reverse surfaces and a central opening;

a semiconductor chip disposed in the central opening, said semiconductor chip having an obverse surface and a plurality of electrodes disposed on said obsesrvse surface, said electrode including at least one ground electrode and at least one power source electrode;

a plurality of leads disposed on and supported by said obverse surface of said insulating substrate, said plurality of leads being connected to corresponding electrodes on said said semiconductor chip, said leads including at least one grounding lead connected to said at least one ground electrode and at least one power source lead connected to said at least one power source electrode;

at least one grounding conductor plate disposed on and directly contacting said reverse surface of said insulating substrate, said at least one grounding conductor plate having an area;

at least one power source conductor plate disposed on and directly contacting said reverse surface of said insulating substrate electrically insulated from said at least one grounding conductor plate, said at least one power source conductor plate having an area, wherein the areas of said at least one grounding conductor plate and said at least one power source conductor plate are substantially equal to each other;

first connecting means electrically connecting said at least one grounding conductor plate to said at least one ground lead;

second connecting means electrically connecting said at least one power source conductor plate to said at least one power source lead; and a package body encapsulating said semiconductor chip and parts of said plurality of leads with parts of each of said plurality of leads exposed outside said package body.

2. A semiconductor device as claimed in claim 1 wherein said first connecting means includes grounding contact holes provided in said insulating substrate.

3. A semiconductor device as claimed in claim 1 wherein said second connecting means includes power source contact holes in said insulating substrate.

4. A semiconductor device as claimed in claim 1 wherein said plurality leads of includes several hundred leads.

5. A semiconductor device as claimed in claim 1 wherein said insulating substrate is a polyimide tape.

6. A semiconductor device as claimed in claim 1 wherein the central opening is rectangular and has four edges and including two grounding conductor plates and two power source conductor plates, said grounding conductor plates being spaced from each other and from said power source conductor plates, each of said grounding conductor plates and said power source conductor plates being disposed adjacent a corresponding edge of the opening.

7. A semiconductor device as claimed in claim 6 wherein said grounding conductor plates and power source conductor plates are alternatingly disposed around the central opening.

8. A semiconductor device as claimed in claim 6 wherein said gorunding conductor plates and power source conductor plates are generally trapezoidal in shape.

* * * * *

UNITED STATES PATENT AND TRADEMARK OFFICE
CERTIFICATE OF CORRECTION

PATENT NO. : 5,220,196

DATED : June 15, 1993

INVENTOR(S) : Michii et al.

It is certified that error appears in the above-identified patent and that said Letters Patent is hereby corrected as shown below:

Claim 1, col. 3, line 10, change "electrode" to --electrodes--, "observse" shoud be --obverse--.

Claim 2, col. 4, line 10, delete "provided".

Claim 4, col. 4, line 15, change "leads of" to --of leads--.

Claim 8, col. 4, line 33, change "gorunding" to --grounding--.

Signed and Sealed this

First Day of February, 1994

Attest:

BRUCE LEHMAN

Attesting Officer     Commissioner of Patents and Trademarks